United States Patent [19]

Coon et al.

[11] Patent Number: 4,760,430
[45] Date of Patent: Jul. 26, 1988

[54] SEMICONDUCTOR DEVICE AND METHOD FOR PRODUCING A FAR INFRARED AND/OR MICROWAVE RADIATION SOURCE UTILIZING RADIATIVE TUNNELLING TRANSITIONS

[75] Inventors: Darryl D. Coon; Hui C. Liu, both of Pittsburgh, Pa.

[73] Assignee: University of Pittsburgh, Pittsburgh, Pa.

[21] Appl. No.: 849,813

[22] Filed: Apr. 9, 1986

[51] Int. Cl.$^4$ .............................................. H01L 33/00
[52] U.S. Cl. ...................................... 357/17; 357/16; 357/58; 357/4; 357/12
[58] Field of Search .................... 357/16, 17, 12, 58, 357/63, 4

[56] References Cited

U.S. PATENT DOCUMENTS

| | | | |
|---|---|---|---|
| 4,163,237 | 7/1979 | Dingle et al. ............... | 357/58 X |
| 4,439,782 | 3/1984 | Holonyak, Jr. ............... | 357/17 |
| 4,578,127 | 3/1986 | Gossard et al. ............... | 357/16 X |

OTHER PUBLICATIONS

Chow et al., "Negative Differential Resistances from $H_{G1-x}Cd_xTe$-CdTe Single Quantum Barrier Heterostructures", *Appl. Phys. Lett.*, 48(21), 26 May 1986, pp. 1485-1487.

Chang et al., "Controlled Emission in Heterojunction Structures", *IBM Technical Disclosure Bulletin*, vol. 20, No. 6, Nov. 1977, pp. 2449-2450.

*Primary Examiner*—Andrew J. James
*Assistant Examiner*—William A. Mintel
*Attorney, Agent, or Firm*—Reed Smith Shaw & McClay

[57] ABSTRACT

The present invention relates to a novel semiconductor heterostructure device characterized by improved coupling of tunnelling current to an electromagnetic field in the region between doped conductive layers of the device comprising a first conductive contact layer comprising a semiconductor including a dopant material, a barrier layer in juxtaposition to the first conductive contact layer comprising a semiconductor of a different material than that of the first layer to control the tunnelling current, a non-barrier layer in juxtaposition to the barrier layer comprising an undoped, semiconductor material to provide improved coupling to the electromagnetic field, a second conductive contact layer comprising a semiconductor including a dopant material, and means for applying a bias voltage potential across the device to generate photon emissions. The invention further relates to a method of producing a far infrared and/or microwave radiation source from radiative tunnelling transitions in a semiconductor device having at least one barrier layer and a plurality of doped conductive contact layers comprising the steps of passing an intraband tunnelling current through the device so as to provide that the photon creation rate of said device is larger than the ohmic damping loss rate, and directing the emitted photons from said device so that the device functions as an electromagnetic radiation emitter which provides increased coupling of said tunnelling current to an electromagnetic field located in the region between the doped conductive layers.

19 Claims, 2 Drawing Sheets

Old Strategy (Interband Transition)

Narrow Gap Semiconductor (e.g. $Hg_x Cd_{1-x} Te$)
Near Infrared Interband Transition Wide Gap Semiconductor Intraband Transition (For Infrared or Microwave)

$Al_x Ga_{1-x} As$  Ga As  $Al_x Ga_{1-x} As$

SEMICONDUCTOR DEVICE AND METHOD FOR PRODUCING A FAR INFRARED AND/OR MICROWAVE RADIATION SOURCE UTILIZING RADIATIVE TUNNELLING TRANSITIONS

ACKNOWLEDGMENT

The invention described herein was made in part during the course of work under National Science Foundation Grant ECA 8202473 and in part during the course of work under sponsorship by the Commonwealth of Pennsylvania acting through the Board of the Ben Franklin Paternership Found and the MPC Corporation.

FIELD OF THE INVENTION

The present invention relates to an improved semiconductor device and to a method for producing a far infrared and/or microwave radiation source from radiative tunnelling transitions in a semiconductor device.

BACKGROUND OF THE INVENTION

Modes of electron tunnelling through semiconductor devices, preferably DC biased quantum well structures, are well known. *Appl. Phys. Lett.* 22, 562 (1973). Normally, the main contribution to the tunnelling current is assumed to come from elastic, nonradiative transitions, but the presence of a potential difference and the charge of the carriers undergoing tunnelling make radiative, inelastic tunnelling transitions unavoidable. See FIG. 2. Relative suppression of radiative processes by one power of the fine structure constant $e^2$ (electron charge squared), as well as enhancements associated with stimulated emission, is generally expected.

Both radiative and nonradiative tunnelling in such semiconductor devices can involve exponentially small tunnelling factors, but at least for emission of soft photons, no substantial exponential relative suppression of radiative tunnelling transitions is expected. Thus, comparisons between radiative and nonradiative processes reduce to a matter of phase space and matrix element considerations particular to planar quantum well geometry. This involves coupling of carriers to the electromagnetic field taken to the nonzero within the portion of the quantum well structure which is sandwiched between heavily doped planar contact layers and within the skin depth in the heavily doped layers of the quantum well structure.

Interband transitions in semiconductor devices occur with wide energy gap materials, such as gallium arsenide, GaAs. See FIG. 1. Where a narrow gap is desired, materials such as $Hg_xCd_{1-x}Te$ are employed. These, however, have proved to be troublesome in practice. A potentially useful feature of the spectrum of electromagnetic radiation which is made available from intraband tunnelling transitions in semiconductor devices is that there is no long wavelength cutoff.

It should thus be possible to fabricate far infrared or microwave radiation sources with fewer materials problems than is possible with devices employing interband transitions in narrow energy gap materials. The spontaneous emission spectrum should be smooth, whereas the stimulated emission spectrum will be peaked.

When an electron tunnels through a quantum well structure, or a finite superlattice, the electron can emit a photon, or absorb a photon, within the quantum well structure and emerge with a lower, or higher, energy. One such schematic model is depicted in FIG. 1. The electromagnetic vector potential is considered with the polarization vector in a direction perpendicular to the superlattice for electromagnetic waves propagating in the plane of the quantum well, or superlattice layers. Propagation in the plane of the quantum well is believed to occur because of the boundary conditions which are imposed by planar doped, conducting layers on each side of the quantum well structure.

It is an object of the present invention to provide semiconductor devices adapted to operate in the intraband tunnelling current transition mode in which there is no inherent long wavelength radiation emission cut-off. It is another object of the invention to provide for far infrared and microwave radiation sources having fewer material of fabrication problems than has been possible with present semiconductor devices utilizing narrow energy gap materials. It is a still further object of the invention to produce a semiconductor device wherein the tunnelling current establishes a photon creation rate which is in excess of the ohmic damping loss rate. It is a further object of the invention to provide a semiconductor device structure which shows an increased coupling of the tunnelling current to the electromagnetic field in the region between the impurity-doped layers which define the boundaries of an intraband transition device. It is yet another objective to provide a semiconductor device, preferably a quantum well structure, capable of operating in a laser mode for stimulated photon emission.

SUMMARY OF THE INVENTION

The present invention relates to a broad-band photon source in the infrared and microwave bands that is dependent upon applied voltage and semiconductor physical parameters. The photon source, preferably constructed as a semiconductor device, comprises a first doped conductive layer, most preferably with gallium arsenide (GaAs); an undoped barrier layer, an optional undoped non-barrier layer, and a second doped conductive layer, most preferably with gallium arsenide (GaAs), all collectively forming a tunnelling junction. The tunnelling junction, when activated, preferably by an applied DC voltage, emits a broad band of radiation over the junction area. Inelastic electron intraband tunnelling permits photo emission from undoped barrier and non-barrier layers. The undoped non-barrier layer provides increased coupling of the quantum well mechanical tunnelling current to the electromagnetic field in the region between the first and second, conductive doped layers of the semiconductor device.

The present invention further relates to a method for producing a far infrared and/or microwave radiation source utilizing radiative tunnelling transitions in a semiconductor device, preferably a quantum well structure, comprising the steps of: (a) passing an intraband tunnelling current through the device so as to create a photon emission pattern; (b) establishing the physical parameters of the barrier layer, and also preferably of the non-barrier layer, so as to provide that the photon creation rate of the device is as large as possible in relation to, and preferably larger than, the ohmic damping loss rate; and (c) directing the emitted photons from the device so that the device functions as an electromagnetic radiation emitter which provides increased coupling of the tunnelling current to the electromagnetic field located in the region between the doped conductive layers of the device.

DETAILED DESCRIPTION OF THE INVENTION

The transition rate of the semiconductor device of the invention depends upon barrier height and thickness. Methods for calculation of ohmic damping loss are known in the art and are given in most standard texts. Making the skin depth, photon energy and the thickness of the barrier small, tends to make the photon creation rate W (expressed in terms of numbers per unit time) larger than damping loss rate $W_{loss}$ (expressed in terms of photon per unit time). The ratio of the two rates (W and $W_{loss}$) can be expressed in terms of impurity concentration and resistivity. Reducing the barrier height by applying a larger bias voltage has an effect similar to reducing the barrier thickness, both of which permit lower energy photons to be more efficiently generated. Further details relating to the invention and to photon emission during intraband tunnelling through semiconductor devices, such as quantum well structures, are given in *Solid State Commum.*, 54, 275-78 (by D. D. Coon and H. C. Liu), the disclosure of which is incorporated herein by reference.

Figure 1:
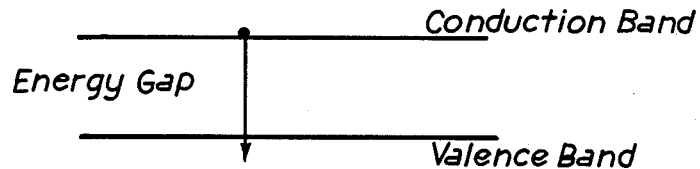
FIG. 1 is a schematic of a photon emission event during intraband transition in the near infrared range occurring in a narrow energy gap semiconductor device.
Figure 2:
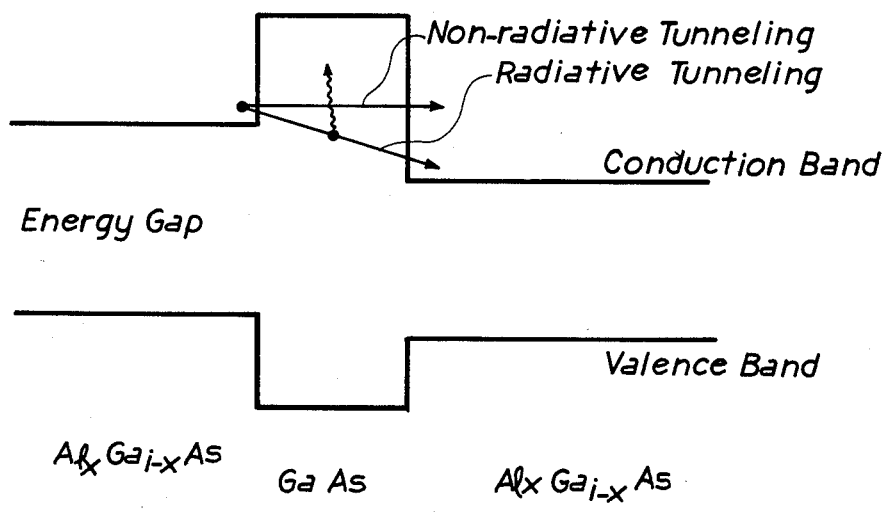
FIG. 2 is a schematic strategy for a wide gap, single barrier, semiconductor device involving both nonradiative and radiative photon emission intraband tunnelling events occurring in a conduction band.
Figure 3:
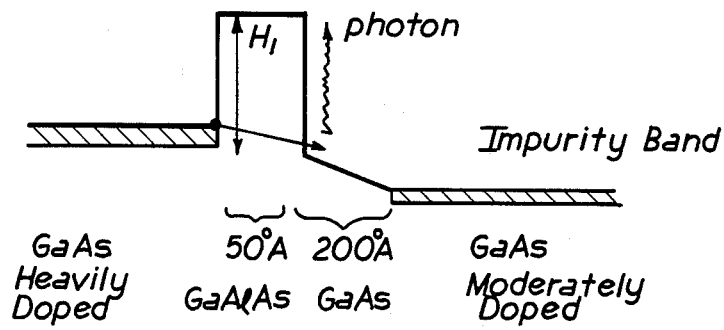
FIG. 3 is a schematic of a qunatum well structure showing the direction of emitted radiation according to the present invention.

Superior performance can be achieved from the semiconductor device structure according to the invention schematically depicted in FIG. 3. The object is to decrease the nonradiative current by widening the barrier and to increase the coupling to the electromagnetic field by adding an undoped layer. The coupling is approximately proportional to the square of the thickness of the undoped region to the right of the barrier. The schematic structure depicted in FIG. 3 permits thickening of the barrier to some extent, and thereby reducing the nonradiative current densities, while at the same time maintaining W greater than $W_{loss}$. At 100 GHz or higher, this could be accomplished with a 200 Å wide gallium arsenide (GaAs) layer and a 50 Å barrier layer sandwiched between the doped conductive contact layers. The structure of FIG. 3 is fabricated with two electron impurity bands, such as silicon-doped gallium arsenide.

Figure 4:
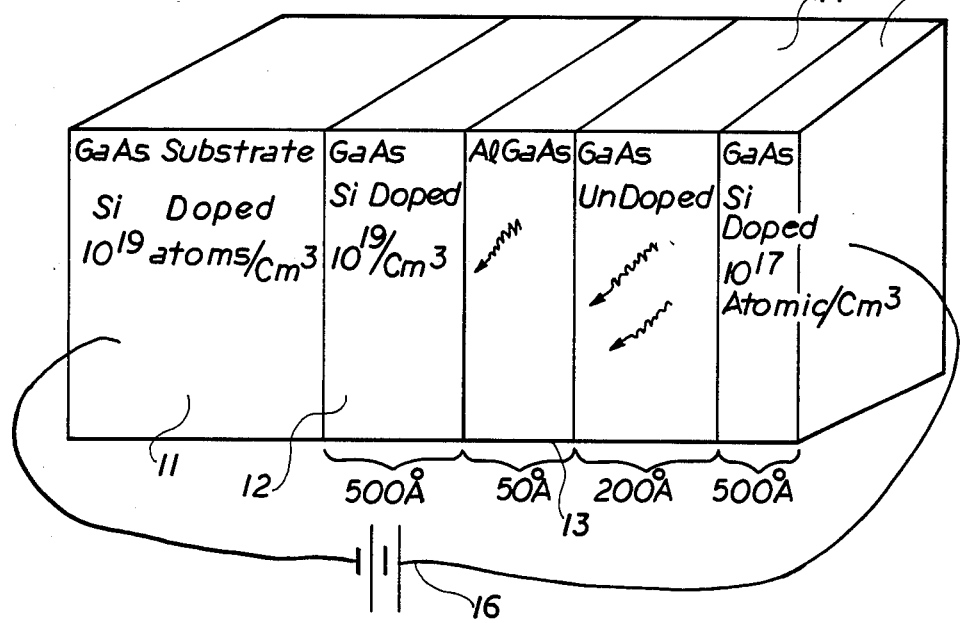
FIG. 4 is a schematic of a semiconductor device of the present invention fabricated by the use of a molecular beam epitaxy technique.

Referring to FIG. 4, the fabrication of a semiconductor device which provides an increased coupling of the quantum well tunnelling current to the electromagnetic field in the doped layer will now be described. The squiggly arrows in FIG. 4 define the intraband photon emission zone.

The wafer 11 which forms a target support substrate for fabrication of the device, preferably by the epitaxial method, is typically of gallium arsenide (GaAs), being already doped, preferably with silicon, to a concentration of $10^{19}$ atoms/cm.$^3$. Epitaxy is then employed to create a first conductive contact layer 12, typically of gallium arsenide (GaAs), preferably including a relatively heavy level of dopant, preferably silicon, to a concentration of about $10^{19}$ atoms/cm.$^3$, with the first doped layer 12 being between about 100 Å and 1000 Å in depth, and preferably on the order of about 500 Å in depth.

A second adjacent layer to be deposited in an undoped barrier layer 13 comprising a semiconductor of a different material, such as aluminum gallium arsenide (AlGaAs), which is from about 10 to 100 Å in depth, and preferably about 50 Å in depth. This layer serves to provide a degree of control of the tunnelling current.

Preferably a third non-barrier, undoped layer 14 is deposited adjacent the barrier layer 13, but is preferably of another material, such as gallium arsenide, and is on the order of between about 50 and 2000 Å in depth, and preferably of about 200 Å in depth. This layer provides for improved coupling to the electromagnetic field.

Finally, a second conductive contact layer 15, typically of gallium arsenide (GaAs), preferably including a moderate level of dopant, preferably silicon, is deposited adjacent the third layer 14, with a typical silicon concentration of about $10^{17}$ atoms/cm.$^3$. This layer corresponds to the impurity band of FIG. 3.

As shown in FIG. 4 there is also included means 16 for applying a bias voltage potential across the device. The biasing means 16 enables the device to generate photon emissions.

The resulting semiconductor device defines a heterostructure photon-emitting diode capable of laser diode current densities, while concurrently maintaining W greater than $W_{loss}$, upon being subjected to applied DC voltages.

Vaccum epitaxy methods for the growth of thin layers of compound-semiconductor materials such as GaAs on GaAs substrates are well known in the art. Though semiconductor fabrication technique is not a part of the present invention, it is described broadly to indicate how the improved device of the present invention is fabricated. Molecular beam epitaxy (MBE) is used in heterostructure light-emitting diodes and injection lasers, and can be used for the growth of the gallium arsenide (GaAs)/aluminum gallium arsenide (AlGaAs)/gallium arsenide (GaAs) heterostructures according to the present invention.

A conventional gas source MBE system can be used for the fabrication of the structure of FIG. 4 and will be briefly described. The epitaxy generally occurs in an ultra-high vacuum chamber in which the substrate wafer, conveniently of GaAs, is positioned on a heater. Arrayed about the target wafer, in radial fashion, are effusion ovens for each of the materials to be deposited upon the wafer, such a gallium, a dopant, arsenic and aluminum. The temperature of each heating coil governs the rate of volatilization of the metal atoms forming the deposition materials.

When an effusion oven is heated, the vapor pressure of the contained elements increases, and under the high vacuum conditions existing in the MBE system, beams of atoms or molecules of the elements are emitted (effused) from the orifice at the top of the oven. Their mean free path is long, relative to the oven to substrate distance, so that they impinge on the heated substrate surface without having undergone collisions. For periodic Group III, IV and V elements, the Group III elements usually having sticking coefficients near unity, while the Group V elements have sticking coefficients which are dependent upon the surface coverage of the Group III elements. At the proper range of growth temperature, sufficient surface mobility exists permitting the atoms to find the appropriate lattice sites, and epitaxy results. Multilayer structures are grown by opening and closing appropriate shutters during layer growth, and compositions are controlled by control of the effusion oven temperatures. The performance of the semiconductor device, here preferably a quantum well structure, as a photon source, can be enhanced by optimal choice of physical parameters perhaps even to the extent of stimulated emissions of photons.

It will be apparent to those skilled in the art that many modifications as to the particular materials, elemental configurations and process parameters may be made without departing from the scope of this basic invention. Therefore, the foregoing embodiments of the present invention should be interpreted as being exemplary of the preferred modes known at this time and not restrictive of the scope of the appended claims.

What is claimed is:

1. A semiconductor heterostructure device characterized by having an increased radiative tunnelling current, a decreased nonradiative tunnelling current and improved coupling of the radiative tunnelling current to an electromagnetic field in the region between doped conductive layers of the device comprising:
   (a) a first conductive contact layer comprising a semiconductor including an N dopant material;
   (b) a barrier layer in juxtaposition to the first conductive contact layer comprising a semiconductor of a different material from said semiconductor of the first layer to decrease the nonradiative tunnelling current and increase the radiative tunnelling current;
   (c) a non-barrier layer in juxtaposition to the barrier layer comprising an undoped, semiconductor material to provide improved coupling of the radiative tunnelling current to the electromagnetic field;
   (d) a second conductive contact layer in juxtaposition to the non-barrier layer comprising a semiconductor including an N dopant material; and
   (e) means for applying a bias voltage potential across the device to generate photon emissions.

2. The device of claim 1 wherein the barrier layer material comprises gallium aluminum arsenide.

3. The device of claim 1 wherein the barrier layer has a thickness of between about 10 and 100 Å.

4. The device of claim 3 wherein the barrier layer has a thickness of about 50 Å.

5. The device of claim 1 wherein the first conductive layer comprises silicon-doped gallium arsenide.

6. The device of claim 1 wherein the second conductive layer comprises silicon-doped gallium arsenide.

7. The device of claim 1 wherein the non-barrier layer comprises gallium arsenide.

8. The device of claim 1 wherein the non-barrier layer has a thickness of between about 50 and 2000 Å.

9. The device of claim 8 wherein the non-barrier layer has a thickness of about 200 Å.

10. The device of claim 1 wherein the first conductive layer is more heavily doped than the second conductive layer.

11. The device of claim 1 wherein the first conductive layer is less heavily doped than the second conductive layer.

12. A method of producing a far infrared and/or microwave radiation source from radiative tunnelling transitions in a semiconductor device having at least one barrier layer and an adjacent undoped non-conductive layer between a plurality of N doped conductive contact layers for increasing the radiative tunnelling current, decreasing a nonradiative tunnelling current and increasing the coupling of the radiative tunnelling current to an electromagnetic field thereon comprising the steps of:
   (a) passing an intraband tunnelling current through the device so as to create a photon emission pattern;
   (b) establishing the physical parameters of the barrier layer so as to provide that the photon creation rate of said device is larger than the ohmic damping loss rate; and
   (c) directing the emitted photons from said device so that the device functions as an electromagnetic radiation emitter which provides increased coupling of said radiative tunnelling current to an electromagnetic field located in the region between the doped conductive layers.

13. The method of claim 12 wherein the semiconductor device is a quantum well structure.

14. The method of claim 12 wherein the device is activated by a DC bias voltage.

15. The method of claim 14 wherein the photon creation rate is controlled by varying the bias voltage.

16. The method of claim 12 wherein the photon creation rate is increased by increasing the width of the region between doped conductive layers.

17. The method of claim 12 wherein the adjacent undoped non-conductive layer comprises a semiconductor material.

18. The method of claim 12 wherein the device has two N doped conductive contact layers, the contact layer adjacent the barrier layer being more heavily doped than the contact layer adjacent the undoped non-conductive layer.

19. The device of claim 1 wherein the coupling to the electromagnetic field of the radiative current is approximately proportional to the square of the thickness of the undoped non-barrier layer.

* * * * *